US007855438B2

(12) United States Patent
Barth

(10) Patent No.: US 7,855,438 B2
(45) Date of Patent: Dec. 21, 2010

(54) DEEP VIA CONSTRUCTION FOR A SEMICONDUCTOR DEVICE

(75) Inventor: Hans-Joachim Barth, München (DE)

(73) Assignee: Infineon Technologies AG, Munich (DE)

( * ) Notice: Subject to any disclaimer, the term of this patent is extended or adjusted under 35 U.S.C. 154(b) by 622 days.

(21) Appl. No.: 11/533,162

(22) Filed: Sep. 19, 2006

(65) Prior Publication Data

US 2008/0067689 A1   Mar. 20, 2008

(51) Int. Cl.
  *H01L 29/06* (2006.01)
  *H01L 21/4763* (2006.01)
  *H01R 12/04* (2006.01)
(52) U.S. Cl. ............ 257/623; 257/774; 257/E23.011; 257/E23.145; 257/E23.577; 257/E23.578; 174/262; 174/264; 438/637; 438/640
(58) Field of Classification Search .............. None
See application file for complete search history.

(56) References Cited

U.S. PATENT DOCUMENTS

| 6,093,966 | A | * | 7/2000 | Venkatraman et al. ...... 257/751 |
| 7,091,618 | B2 | * | 8/2006 | Yoshizawa et al. .......... 257/774 |
| 2005/0009329 | A1 | | 1/2005 | Tanida et al. |
| 2006/0043598 | A1 | | 3/2006 | Kirby et al. |
| 2007/0096329 | A1 | * | 5/2007 | Suzuki et al. ............... 257/774 |

\* cited by examiner

*Primary Examiner*—Alonzo Chambliss
(74) *Attorney, Agent, or Firm*—Coats & Bennett, P.L.L.C.

(57) ABSTRACT

An integrated circuit semiconductor device includes a substrate, a deep via within the substrate which is provided with a dielectric cladding in contact with the substrate, metal fill located within the deep via and defining an upper surface, interconnect wiring, and a dielectric layer located above the deep via and a void between the upper surface of the metal fill and the dielectric layer. The interconnect wiring layer contacts the metal fill laterally.

15 Claims, 3 Drawing Sheets

DEEP VIA CONSTRUCTION FOR A SEMICONDUCTOR DEVICE

BACKGROUND OF THE INVENTION

The present invention relates to a deep via construction for an integrated circuit semiconductor device, such as a chip, and to a method of manufacturing such a construction.

Deep vias, for example those greater than 5 µm, that are filled with metals such as, for example, copper, aluminium and tungsten, can experience thermal problems. This is especially the case in through-Si-vias that are used in three-dimensional chip stacking applications, which can be more than 100 µm in depth. Copper, for example, has a coefficient of thermal expansion (CTE) of around 16 ppm/° C. This means that a typical 50 µm deep copper filled via will expand in length by approximately 300 nm when it is heated from room temperature to 400° C, which is an example of a temperature reached during wafer processing, for example in chemical vapour deposition (CVD) or final annealing in back-end-of line (BEOL) processes. In other applications, the via depth can vary from 5 µm up to 300 µm, resulting in a thermal expansion of the via between 30 nm and 1800 nm. Should such expansion occur, then the materials closely surrounding the deep via, especially those films and the like located or deposited above the deep via, will be subject to severe stress that may lead to cracks and to film delamination.

Deep vias are formed in dielectric layers and comprise a dielectric cladding in contact with a substrate such as a silicon substrate and a metal fill in contact with the dielectric cladding. A contact area electrically connects the metal fill to interconnect wiring. Conventionally, the contact area is located above the upper surface of the metal fill of the deep via. The construction of conventional deep vias is such that should thermal expansion occur in the metal fill, dielectric and or metal layers located above the vias are subjected to considerable stress forces that may result in the formation of cracks.

SUMMARY OF THE INVENTION

According to the methods and apparatus taught herein, one embodiment of an integrated circuit semiconductor device comprises a substrate, a deep via within the substrate, a metal fill located within the deep via and defining an upper surface and an interconnect wiring. A contact area electrically connects the metal fill to the interconnect wiring, the contact area being located laterally of the deep via such that the contact area does not contact the upper surface of the metal fill.

Of course, the present invention is not limited to the above features and advantages. Those skilled in the art will recognize additional features and advantages upon reading the following detailed description, and upon viewing the accompanying drawings.

BRIEF DESCRIPTION OF THE DRAWINGS

The various aspects and preferred embodiments of the present invention will be described by way of example with reference to the accompanying drawings.

DETAILED DESCRIPTION

Figure 1:
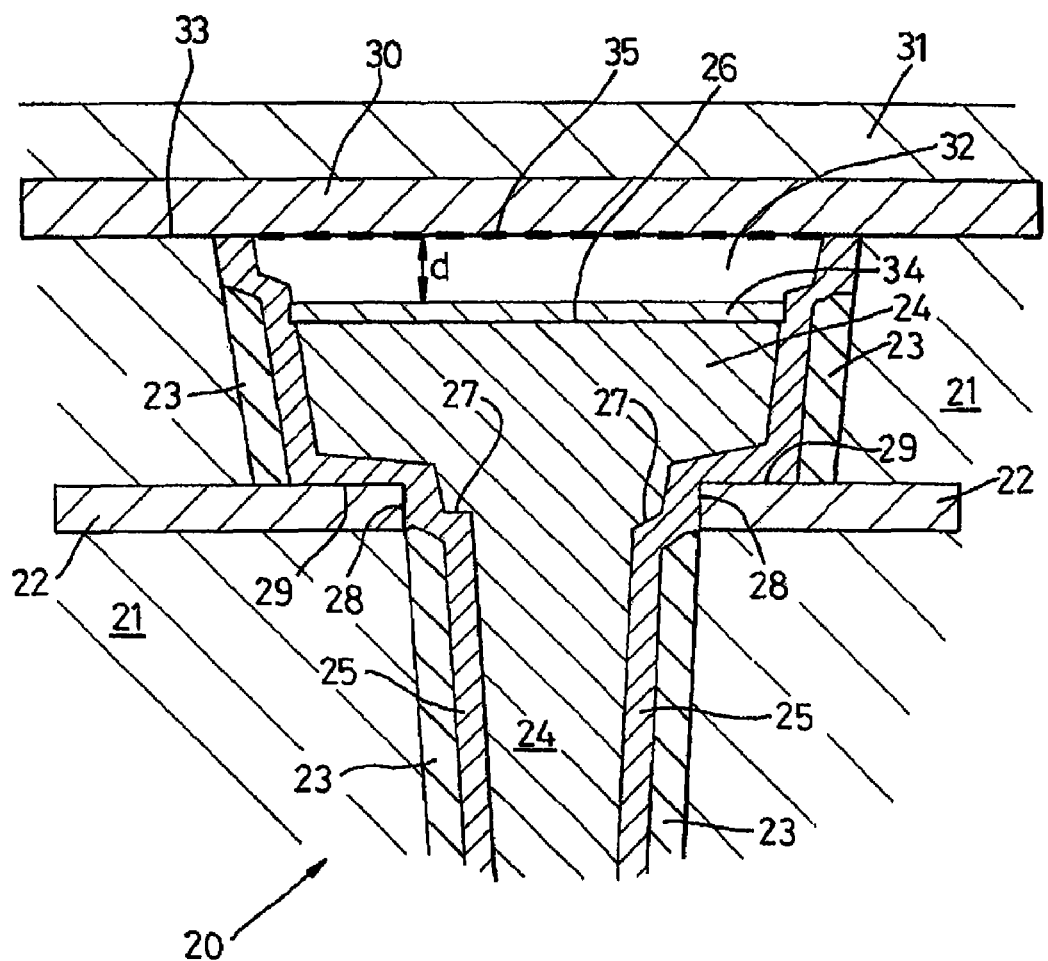
FIG. 1 is a schematic diagram, which is not to scale, of an embodiment of a deep via in a semiconductor device with interconnect wiring to other devices.

With reference to FIGS. 1 and 2, an exemplary embodiment of the present invention is described. FIGS. 1 and 2 show a deep via 20 in a substrate 21 of an integrated semiconductor circuit that is provided with interconnect wiring 22 providing electrical contact to other devices or interconnects (not shown). The deep via 20 is provided with a dielectric cladding 23 in contact with the substrate 21 and metal fill 24 surrounded by the dielectric cladding 23. The metal fill 24 may comprise any metal or metal alloy such as, for example, copper (Cu), aluminium (Al), tungsten (W) or a doped version of these metals such as, for example, CuAl, CuAg, CuMn, CuMg CuSn, CuZr, AlCu, AlSiCu, etc. Between the dielectric cladding 23 and the metal fill 24 is a contact area in the form of a metal barrier layer 25. The metal barrier layer 25 electrically connects the metal fill 24 to the interconnect wiring 22.

The term "substrate" as used within this application is to be interpreted in a broad sense including any known substrate such as a single layer, multiple layers connected to each other or to a stack of layers. The substrate may comprise multiple integrated circuits that may be provided in different levels of the substrate.

Figure 2A:
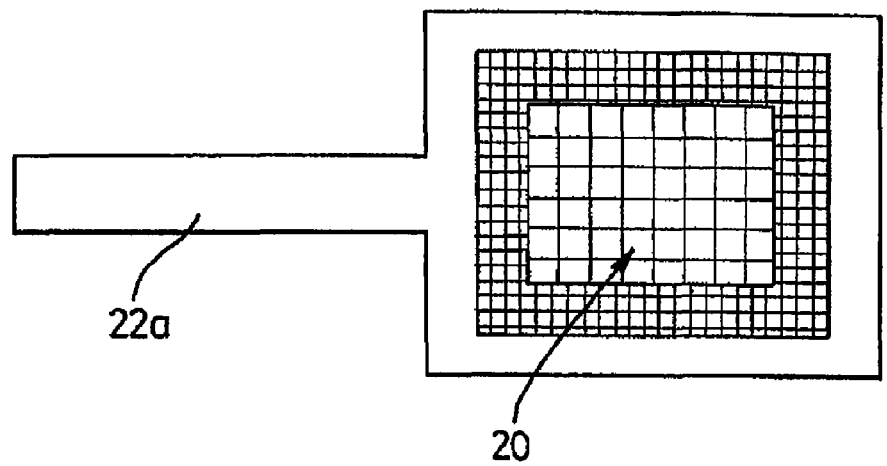
FIGS. 2a and 2b are schematic plan views of two alternate embodiments of deep via constructions with a contact area between the resepctive deep vias and interconnect wiring.
Figure 2B:
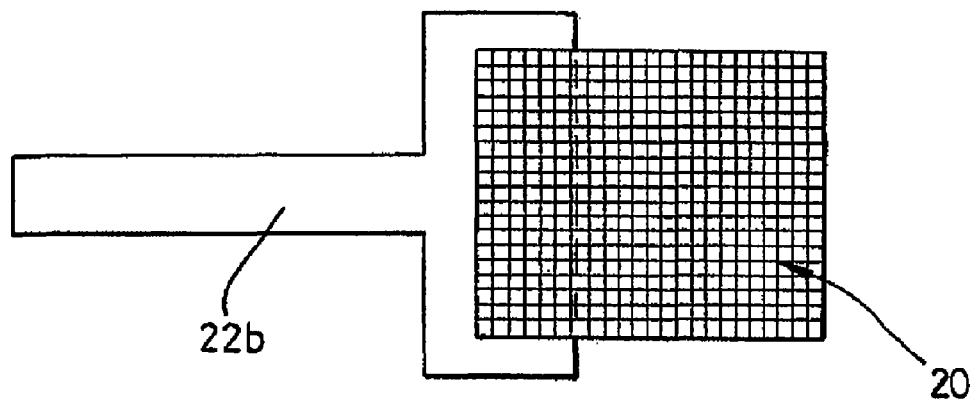

As shown in FIG. 1, the metal barrier layer 25 comprising the contact area is located laterally within the deep via 20 and laterally surrounds the metal fill 24. The metal barrier layer 25 extends up to a top surface (see 33) of the dielectric part of the substrate 21 and extends over an upper surface 26 defined by the metal fill 24. The interconnect wiring 22 is located laterally with respect to the deep via 20 and not above it. As shown in FIGS. 2a and 2b, in some embodiments of the invention the interconnect wiring 22a may completely surround the deep via 20 with a loop of wiring (FIG. 2a) but in other alternative embodiments of the invention the interconnect wiring 22b only partially surrounds the deep via 20 and defines a bifurcate-shape or an L-shape (FIG. 2b).

In embodiments of the invention, the interconnect wiring 22 is located below the upper surface 26 of the metal fill 24 and contacts the metal fill 24 through a break or at least one gap in the dielectric cladding 23. The electrical contacts of the via may be located laterally of the via in a way that does not contact the upper surface 26 of the metal fill 24. In an embodiment, as shown in FIG. 1, the deep via 20 defines a lateral step 27 where the dielectric cladding 23 is absent or has been removed and the interconnect wiring 22 is located at the level of this lateral step 27 such that it is in electrical contact with the metal barrier layer 25 both laterally, that is vertically along its end face 28, and along at least a part of its upper face 29. Hence, the metal barrier layer 25 contacts the wiring 22 both laterally and along a bottom surface created by the lateral step 27.

It will be appreciated that the provision of the metal barrier layer 25 and the lateral connection of the interconnect wiring 22 thereto ensures that the electrical connection between these two elements will not be adversely affected if the metal fill 24 expands. To the contrary, with conventional deep vias, the electrical connection between the contact area and interconnect wiring takes place above the level of metal fill. As a result, the conventional electrical connection is deleteriously affected by cracks or delamination that occurs in layers located above the metal fill.

In one embodiment of the invention, an additional feature may be provided to prevent thermal expansion of the metal fill 24 from adversely affecting a dielectric layer or layers 30, 31 deposited above the via 20. This involves a recessing of the upper surface 26 of the metal fill 24 to define a void 32 between the upper surface 26 and a lower surface 33 of the lowermost dielectric layer 30. According to this embodiment, a void 32 exists at room temperature and at normal ambient operating temperatures of most electronic devices, e.g., up to 150° C. Room temperature as used herein is a temperature between 20° C. and 25° C. inclusive. Preferably, the metal fill 24 is recessed by a distance d that is at least equal to the expansion of the metal fill 24 at a temperature at least equal to the highest temperature reached during manufacture of the semiconductor circuit.

Thus, during manufacture of the circuit, which is described in more detail below, the metal fill 24 does not expand to an upper level greater than the level of an interface 33 defined between the substrate 21 surrounding the deep via 20 and the lower surface of the overlying dielectric layer 30. Hence, the metal fill 24 exerts no or minimal pressure on the layers 30, 31 located or deposited above the deep via 20.

As shown in FIG. 1, the dielectric layer or layers 30, 31 located above the deep via 20 may comprise a dielectric layer 30 that may be a diffusion barrier or cap layer made, for example, of silicon nitride ($Si_3N_4$), silicon carbide (SiC) or silicon carbon nitride and/or, in some cases, an inter-metal dielectric or passivation layer 31 made from silicon oxide ($SiO_2$) or a material with a low dielectric constant, for example fluorosilicate glass (FSG) or dense or porous low-K materials. In some embodiments, selective metal caps (not shown) may be used as metal diffusion barriers and the dielectric cap layer 30 may not be provided. Such metal cap layers may be made of the following materials, for example, COWP, COWB, NiMoP, NiReP, NiWP, Ru, etc.

Preferably, adhesion between the metal fill 24 and the dielectric layer 30 is minimal during manufacture of the circuit. To that end, an anti-adhesion coating 34 having a weak adhesion to the dielectric layer 30 may be deposited over the upper surface 26 of the metal fill 24. In some embodiments this anti-adhesion coating 34 is comprised of a selective, deposited immersion gold (Au) coating but in other embodiments may be comprised of a nickel-gold (Ni—Au) coating formed by e-less deposition. In yet other embodiments, the anti-adhesion coating 34 may be comprised of a self-assembled monolayer (SAM) applied selectively on the upper surface 26 of the metal fill 24. The coating 34 preferably exhibits a good adhesion to the metal fill 24 but a weak adhesion to the subsequently deposited overlying dielectric layer 30, 31. In embodiments comprising a metal cap between the upper surface of the metal fill 24 and the anti-adhesion coating 34, an immersion gold (Au) may be used as the anti-adhesion coating 34.

Figure 3:
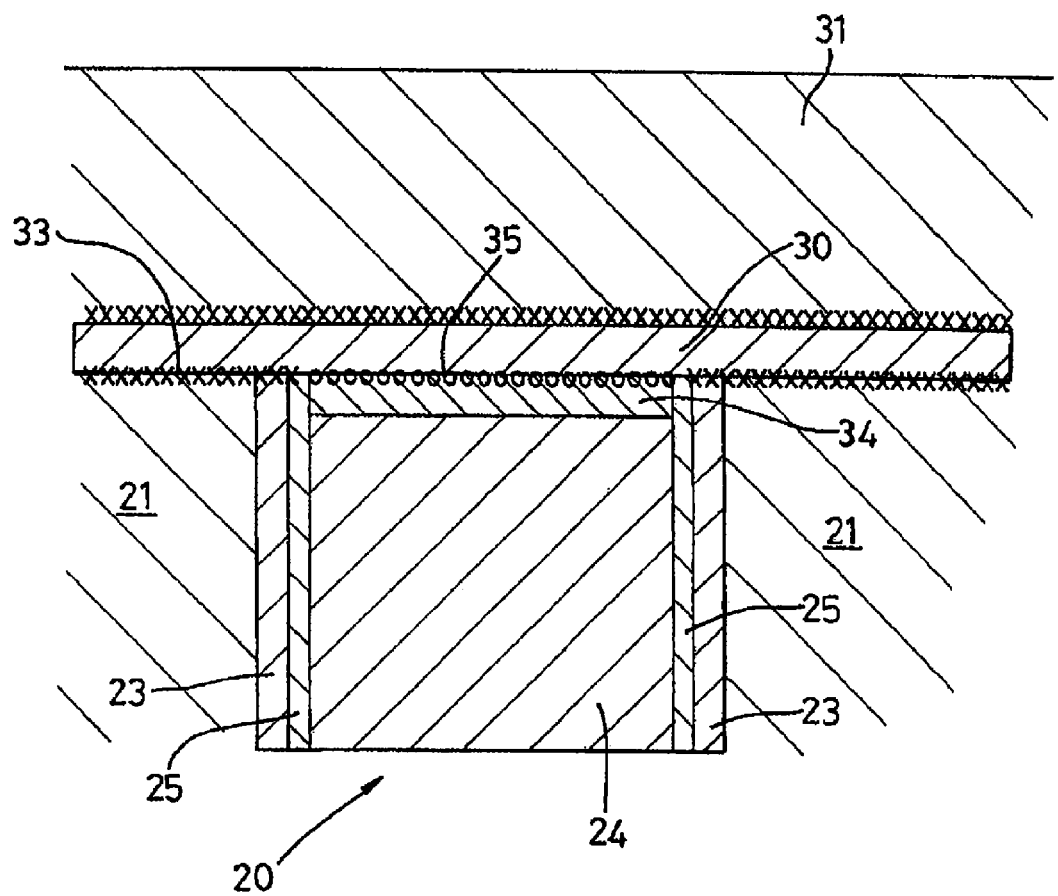
FIG. 3 is a schematic diagram of an embodiment of an upper portion of a deep via construction similar to that shown in FIG. 1 at a stage during manufacture when it is at its maximum temperature during or immediately after deposition of a dielectric layer above the deep via.

An example of a manufacturing process to produce a semiconductor chip in accordance with one embodiment of the invention is described in more detail below. During the manufacturing process, the metal fill 24 is preferably recessed by a distance d that is at least equal to the expansion of the metal fill 24 at the highest temperature reached during manufacture of the semiconductor circuit. When the dielectric cap 30 and inter-metal dielectric or passivation layer 31 are deposited, the temperature used may be the highest temperature or equal to the highest temperature reached in the subsequent processing. As shown in FIG. 3, the situation during or immediately after deposition of the layers 30, 31 may be that where the anti-adhesion coating 34 is in contact with the lower surface 35 of the lowermost dielectric layer 30 and the void 32 is not present, when the metal fill 24 has reached its maximum expansion.

To prevent delamination on cooling, the layers 30 and 31 are chosen to have an excellent adhesion between them and between the layer 30 and the substrate 21, i.e. all surrounding dielectrics, along the lines indicated by the symbol "xxxx". However, to minimize sticking of the metal fill 24 to the layer 30 there may only be a very weak adhesion between the dielectric layer 30 and the anti-adhesion coating 34 along the line indicated by the symbol "oooo". Before the deposition of the dielectric layer 30, the wafer may be heated up to the deposition temperature, so that the metal fill 24 of the deep via 20 has sufficient time to expand. During the deposition of the dielectric layer 30, the upper surface 26 of the metal fill 24, including the anti-adhesion coating 34, may be maintained essentially planar and level with the upper surface of the surrounding dielectric 21 or at least substantially planar, e.g., within a narrow range of a few nanometers, say less than +/−20 nm. The layer 30 is then deposited as a planar layer evenly over the recessed metal-filled via 20.

Preferably, the inter-metal dielectric layer 31 is then deposited over the layer 30 while the wafer is maintained at approximately the same temperature without any lowering of the wafer temperature between deposition steps. This can take place, for example, in the same deposition chamber or in a multi-chamber deposition system without exposure to atmosphere and with excellent adhesion to the cap layer 30. After the deposition of the layers 30 and 31, the wafer temperature can be lowered. When this happens, the metal fill 24 will contract and the void 32 will form at the interface between the anti-adhesion coating 34 and the lower surface 35 of the dielectric cap layer 30.

A chip incorporating a deep via 20 in accordance with the invention may be manufactured as follows. First, a semiconductor wafer such as a Si-wafer with devices and (multi-level) interconnects, for example based on Al, Cu, Ag, W, etc. metallization and Si-oxide, FSG or dense or porous low k dielectrics is provided. Deep via etching is then carried out, for example through BEOL interconnect stack, device level and deep into the Si substrate 21. Resist and/or dielectric, or metal hardmasks can be used during patterning. A defined area of the metal level may be chosen for the electrical contacts and then exposed so that the deep via 20 can be etched. The chosen area preferably exhibits a good etch selectivity during the deep via etch.

A thin and conformal dielectric cladding 23, for example CVD or PE CVD Si-oxide, nitride, or other dielectric material, is then deposited within the via 20. Thereafter a spacer etch of this dielectric cladding 23 is carried out to expose planar areas and part of the vertical sidewalls of the metal contacts comprising the interconnect wiring 22. A thin and preferably conformal metal barrier layer 25, for example of Ta, TaN, WCN, WN, Ti, TiN, Ru, etc. or any combination thereof, is then deposited by known techniques, for example CVD, ALD, PVD, e-less, etc. This metal barrier layer 25 provides the electrical contact to the exposed areas of the interconnect wiring 22.

After the metal barrier layer 25 has been deposited, the metal fill 24 and overfill of the deep via 20 with a conductor such as Cu, Al, W, etc., or any potential alloys thereof, is carried out. Via filling may be done by electroplating (making use of a conductive seed layer) or by direct plating over the barrier layer 25 or by CVD, ALD, PVD, etc. processes or by any combination thereof. Chemical-mechanical planarization (CMP) may then be carried out to planarize the upper surface of the metal fill/overfill 24. The metal fill 24 is then recessed by dry or wet etching to produce the void 32 such that the depth d of the void 32 is at least equal to the expansion of the metal fill 24 at a temperature at least equal to the highest temperature to be reached during subsequent processing steps.

Thereafter, the recessed upper surface 26 of the metal fill 24 is covered by a thin anti-adhesion coating 34 by selective deposition. For example, by deposition of an immersion Au-layer on a Cu surface, or a combined e-less deposition of Ni plus an immersion Au-coating. Au is known to have weak adhesion to dielectric layers. Other embodiments may provide self-assembled monolayers (SAMs) with good adhesion on the underlying metal surface but weak adhesion to dielectrics. Before the deposition of the anti-adhesion coating 34, an optional selective metal cap layer (not shown) such as CoWP, CoWB, NiMoP, NiWP, NiReP, Ru, etc. may be provided.

As described above with reference to FIG. 3, deposition of the dielectric cap 30 or dielectric diffusion barrier 31, for example comprised of $Si_3N_4$, SiC, SiCN, or the like, may be performed at the maximum temperature of the subsequent processing steps. Hence, before the deposition starts the wafers may be heated to the deposition temperature in order to allow the metal fill 24 of the deep via 20 to expand up to the level of the surrounding dielectric surface, in order to have a substantially planar surface during the deposition. Ideally the dielectric cap layer 30 has a weak adhesion to the anti-adhesion layer 34 on the metal fill 24 but by the same token a strong adhesion to the dielectric surface surrounding the deep via 20. Weak adhesion is characterized by interfacial fracture energies Gc below 1 $J/m^2$, as measured by the 4-point-bend method, whereas strong adhesion has Gc values above 5 $J/m^2$.

Subsequent deposition of the inter-metal dielectric (IMD) or passivation dielectric layer 31, for example comprised of Si-oxide, Si-nitride, FSG, a dense or porous low dielectric constant k material, takes place preferably without lowering the wafer temperature after the deposition of the cap layer 30. The subsequent dielectric layer 31 preferably has strong adhesion to the dielectric cap layer 30 underneath it and can be carried out in the same deposition chamber as the deposition of the dielectric cap layer or in a multi-chamber system without exposure to the atmosphere. Thereafter, during the following cooling step the metal fill 24 will contract and form the void 32 at the interface between the anti-adhesion coating 34 and the dielectric cap layer 30. Provided that all subsequent processing steps are performed at temperatures below the cap layer deposition temperature, the metal fill 24 in the deep via 20 will have sufficient room to expand into the void 32 without cracking or otherwise destroying the overlying and/or surrounding layers 21, 30, 31.

Finally, at the end of the wafer processing, the semiconductor-wafer can be thinned by grinding and/or backside etching (wet or dry) until the metal filled vias 20 are exposed and can be assembled in a 3D-chip stack (wafer-to-wafer, chip-to-wafer, chip-to-chip approach) making use of metal-to-metal bonding, for example Cu-to-Cu bonding, or similar, or any known bumping or micro-bumping technology. It is to be understood that the steps of the methods of manufacturing the various embodiments described within the specification and the claims may be interchanged and they are not described or defined in a specific order even if they are described or claimed as being performed one after another.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. An integrated circuit semiconductor device with interconnect wiring comprising:
   a substrate defining a deep via which is provided with a dielectric cladding in contact with the substrate;
   metal fill located within the dielectric cladding and defining an upper surface;
   a metal barrier layer located between the metal fill and the dielectric cladding, the metal barrier layer electrically connecting the metal fill to the interconnect wiring through at least one lateral gap in the dielectric cladding, the lateral gap being disposed along a side of the deep via below the upper surface of the metal fill such that the interconnect wiring forms an electrical connection with the metal fill at the side of the deep via and not the upper surface of the metal fill; and
   a dielectric layer located above the deep via, wherein the upper surface of the metal fill is recessed within the deep via to define a void between the upper surface of the metal fill and the dielectric layer, the void existing at least at normal room temperatures and normal device operating temperatures.

2. The device as claimed in claim 1, wherein the interconnect wiring is located at a level lower than that of the upper surface of the metal fill.

3. The device as claimed in claim 1, wherein the deep via defines a lateral step and the interconnect wiring is located at a level of the lateral step such that the interconnect wiring is in electrical contact with the metal barrier layer laterally and along at least a part of an upper face of the interconnect wiring.

4. An integrated circuit semiconductor device comprising:
   a substrate;
   a deep via within the substrate which is provided with a dielectric cladding in contact with the substrate;
   metal fill located within the deep via and defining an upper surface;
   interconnect wiring; and
   a dielectric layer located above the deep via and a void between the upper surface of the metal fill and the dielectric layer,
   wherein the interconnect wiring contacts the metal fill laterally.

5. The device as claimed in claim 4, further comprising a metal barrier layer located between the metal fill and the dielectric cladding, the metal barrier layer electrically connecting the metal fill to the interconnect wiring via one or more gaps in the dielectric cladding.

6. The device as claimed in claim 4, wherein the dielectric layer comprises a dielectric cap.

7. The device as claimed in claim 4, wherein the dielectric layer comprises an inter-metal dielectric made from a material with a relatively low dielectric constant.

8. The device as claimed in claim 4, wherein the metal fill is spaced from the dielectric layer by a distance approximately equal to or greater than a maximum distance the metal fill expands during manufacture of the device.

9. The device as claimed in claim 4, further comprising an anti-adhesion coating deposited on the upper surface of the metal fill, the anti-adhesion coating configured to adhere more strongly to the metal fill than to the dielectric layer.

10. The device as claimed in claim 9, further comprising a metal cap between the upper surface of the metal fill and the anti-adhesion coating.

11. A semiconductor device comprising:
a substrate;
a deep via within the substrate, the deep via extending in a vertical direction from a lower level to an upper level and provided with a dielectric cladding in contact with the substrate;
metal fill located within the deep via;
an interconnect wiring layer electrically contacting the metal fill at a lateral side of the deep via disposed below the upper level, the interconnect wiring layer having an upper surface lower than the upper level of the deep via; and
a dielectric layer located above the deep via and a void between the upper surface of the metal fill and the dielectric layer.

12. The device as claimed in claim 11, wherein the upper surface of the interconnect wiring layer is lower than an upper surface of the metal fill.

13. The device as claimed in claim 11, wherein the metal fill is spaced from the upper level of the deep via by a distance approximately equal to or greater than a distance the metal fill expands during heating of the metal fill to a temperature of at least approximately 300° C.

14. The device as claimed in claim 11, wherein the metal fill is spaced from the upper level of the deep via by a distance of at least approximately 20 nm.

15. The device as claimed in claim 11, wherein the interconnect wiring layer contacts the metal fill laterally.

* * * * *